(12) United States Patent
Bergstedt

(10) Patent No.: US 6,717,063 B2
(45) Date of Patent: Apr. 6, 2004

(54) MULTI-LAYER CIRCUIT BOARD WITH SUPPORTING LAYERS OF DIFFERENT MATERIALS

(75) Inventor: Leif Bergstedt, Sjömarken (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 232 days.

(21) Appl. No.: 09/793,188

(22) Filed: Feb. 26, 2001

(65) Prior Publication Data

US 2001/0016980 A1 Aug. 30, 2001

Related U.S. Application Data

(62) Division of application No. 09/154,503, filed on Sep. 17, 1998.

(30) Foreign Application Priority Data

Sep. 17, 1997 (SE) ................................................ 9703344

(51) Int. Cl.[7] ................................................. H05K 1/00
(52) U.S. Cl. ...................................... 174/258; 174/259
(58) Field of Search ............................... 174/256, 258, 174/259; 361/756, 792–795, 812; 29/830

(56) References Cited

U.S. PATENT DOCUMENTS

| | | | | |
|---|---|---|---|---|
| 4,180,608 A | * | 12/1979 | Del ............................ | 156/235 |
| 4,806,188 A | | 2/1989 | Rellick | |
| 5,065,285 A | | 11/1991 | Nagai et al. | |
| 5,434,751 A | * | 7/1995 | Cole et al. .................... | 156/289 |
| 5,576,517 A | * | 11/1996 | Wojnarowski et al. ....... | 174/258 |
| 5,620,782 A | * | 4/1997 | Davis et al. ................. | 174/255 |
| 5,679,444 A | * | 10/1997 | Davis et al. ................. | 174/256 |
| 5,993,945 A | * | 11/1999 | Russell et al. ............... | 174/258 |
| 6,033,765 A | * | 3/2000 | Takahashi et al. ........... | 174/258 |

FOREIGN PATENT DOCUMENTS

| | | |
|---|---|---|
| JP | 1025597 | 1/1989 |
| JP | 63-47127 | 3/1989 |
| JP | 6032670 | 5/1994 |
| JP | 7249869 | 9/1995 |
| WO | 96/08945 | 3/1996 |

* cited by examiner

*Primary Examiner*—David L. Talbott
*Assistant Examiner*—Jeremy Norris

(57) ABSTRACT

The invention relates to a process for manufacturing a structure (100) for a circuit board which comprises a plurality of supporting layers (10, 30, 60, 90), all of different materials, which supporting layers (10, 30, 60, 90) support electrically conducting patterns (20, 50, 70, 120). According to the process, the material for a first supporting layer (10) is that material which has the highest melting point of the different materials for supporting layers, subsequent to which, beginning from the first supporting layer (10), new supporting layers (30, 60, 90) are arranged successively. As material for each new supporting layer (30, 60, 90), a material is chosen with lower melting point than the supporting layer which is closest in the direction of the first supporting layer (10). Each new supporting layer (30, 60, 90) is attached to the structure (100) by exposing the structure (100) to a temperature which exceeds the melting point of the new supporting layer (30, 60, 90) but is lower than the melting point for that supporting layer which is the closest in the direction of the first supporting layer (10). Furthermore, on at least one side of each new supporting layer (30, 60, 90) electrically conducting patterns (50, 70, 120) are arranged, and the electrically conducting patterns (20, 50, 70, 120) on at least two supporting layers (10, 30, 60, 90) are connected to each other. The invention also relates to a circuit board manufactured according to this process.

10 Claims, 3 Drawing Sheets

MULTI-LAYER CIRCUIT BOARD WITH SUPPORTING LAYERS OF DIFFERENT MATERIALS

This application is a divisional of U.S. patent application Ser. No. 09/154,503, entitled "Multi-layer Circuit Board" filed on Sep. 17, 1998.

BACKGROUND

The present invention relates to a process for manufacturing a multi-layer circuit board and a multi-layer circuit board manufactured according to this process.

A conventional technique for obtaining circuit boards with all interapaces between the components which are mounted on the surface of the circuit board, in other words circuit boards having a high so-called packing density, is to produce the circuit board as a multi-layer board. A multi-layer circuit board comprises a plurality of supporting layers of non-conducting material on which a conducting pattern is arranged. The conducting patterns on the various supporting layers are connected to one another in desired fashion through the creation of holes, so called "via-holes", between the various supporting layers at the locations in which connection is required. The via-holes are made electrically conducting by being wholly or partially filled with electrically conducting material.

A known technique for joining together the various supporting layers in a multi-layer circuit board is by so-called "fusion bonding". This means that the conducting patterns are arranged on the various supporting layers, and the various layers are arranged one on top of the other in desired fashion, subsequent to which the structure which is thus formed is exposed to a temperature in excess of the melting point for the material in the supporting structure. A problem which arises in this process is that when the supporting layers reach or exceed their melting point, the forms of the conducting patterns can alter due to movements in the supporting layers. When the supporting layer then stiffens, the conducting patterns might therefore not have precisely the same form which they had earlier.

Because of the above-described problem, the conducting patterns often have to be made wider than required in order to ensure that the desired region is covered by conducting patterns. This adds to the difficulty of producing circuit boards with small conducting patterns and small intervals between the conducting patterns.

An alternatively previously known technique in fusion bonding is to place between the supporting layers materials which have a lower melting point than the supporting layers. When heated, the structure will thus be joined together without the structure of the conducting patterns being affected by dimensional changes in the supporting layers. This technique leads however to increased manufacturing costs, and results in the height of the structure becoming greater than desired.

Japanese patent document JP 63 047127 describes a method for manufacturing circuit boards which is based upon a number of basically identically structured laminates being joined together one on top of the other. Each laminate comprises a core which, on its upper and lower side, is surrounded by an outer material with lower melting point than the core. The laminate is heated to a temperature which exceeds the melting point of the outer material but is lower than the melting point of the core. The various strata of the laminate are thus made to fasten together.

A drawback with this method seems to be that each supporting stratum has to be surrounded by two other strata, whose only real function is that of adhesive layers. Japanese patent document JP 01 025597 shows a method in which supporting layers are surrounded by various types of paste with different melting points. This method appears to lead to higher material costs and multiple stages in the production of the circuit boards.

Document WO 96/08945 shows a method which is typical of the method using various strata whose only function is that of adhesive layers.

SUMMARY

The problem which is solved by the present invention is thus to achieve a method for manufacturing multi-layer circuit boards, which method is cheap and simple to use, and allows the various supporting layers in the board to be fastened in place without adhesive strata or other intermediate strata.

The invention solves this problem through a process for manufacturing a multi-layer circuit board comprising a plurality of supporting layers for conducting patterns, in which the supporting layers are all of different materials. As material for a first supporting layer for conducting patterns, that material is chosen which has the highest melting point of the different materials for supporting layers for conducting patterns. On this first supporting layer there is arranged a first conducting pattern Of desired shape.

Starting from the first supporting layer, new supporting layers are arranged successively in which, as material for each new supporting layer, a material is chosen with lower melting point than the supporting layer which is closest in the direction of the first supporting layer. Each new supporting layer is attached to the structure by exposing the structure to a temperature which exceeds the melting point of the new supporting layer but is lower than the melting point for the supporting layer which is closest in the direction of the first supporting layer. In this way, the conducting patterns present in the structure will not be affected by movements in their respective supporting layers.

Once the structure, after each heating, has regained a temperature which allows the new uppermost supporting layer to be worked, a conducting pattern of desired shape is created on at least one side of the new uppermost supporting layer.

Electrically conducting patterns in at least two supporting layers are connected to each other. These connections are preferably constituted by via-holes.

The process is repeated until the desired number of layers are present in the structure. On the uppermost layer, conducting patterns and/or electronics components can be arranged.

BRIEF DESCRIPTION OF THE DRAWINGS

The invention will be described in greater detail below with the aid of an example of an embodiment, and with reference to the appended drawings in which.

DETAILED DESCRIPTION

Figure 1A:
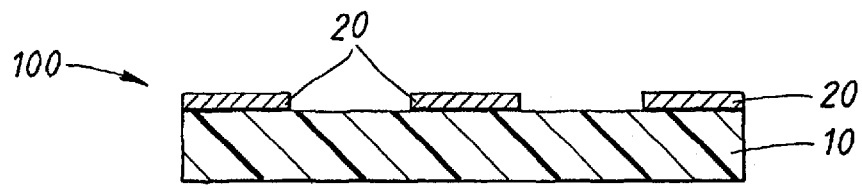
FIGS. 1a–1g show diagrammatically in cross-section the manufacture of a circuit board according to the present invention.

FIG. 1a illustrates in diagrammatic cross-section a supporting layer 10 bearing a conducting pattern 20. The supporting layer 10 will constitute a first layer in a structure 100 for a circuit board. The structure 100 will comprise a plurality of supporting layers for conducting patterns, which supporting layers are all of different materials.

A suitable material for the first layer 10 is a PTFE material (polytetrafluoroethylene) with a relatively large content of glass, thereby producing good dimensional stability, for example TACONIC TLC 32®.

Figure 1B:
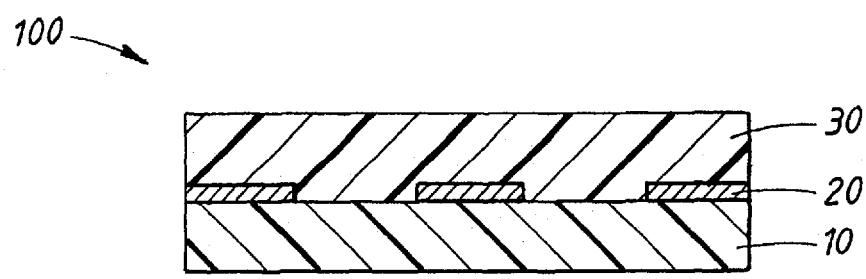

In FIG. 1b, the structure 100 from FIG. 1a is enlarged by a second supporting layer 30. As material for the second supporting layer 30, a material is chosen with lower melting point than the first supporting layer 10.

The second supporting layer 30 is attached to the structure 100 by exposing the structure 100, inclusive of the second supporting layer 30, to a temperature which exceeds the melting point for the second supporting layer 30 but is lower than the melting point for the first supporting layer 10. In this way, the conducting pattern 20 which is present in the structure 100 will not be affected by movements in the supporting layer 10 which bears the conducting pattern 20.

Figure 1C:
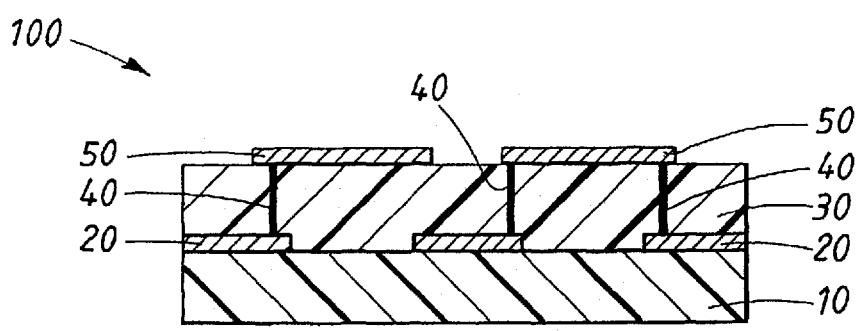

When the second supporting layer 30 has thus been attached to the structure 100 and has subsequently assumed a temperature which is lower than its melting point, a second conducting pattern 50 of desired shape is arranged on top of the second supporting layer 30, thereby producing the structure 100 which is shown in FIG. 1c.

The conducting patterns 20, 50 which are now present on the supporting layers 10, 30 in the structure 100 are connected at desired locations by means of via-holes 40. The via-holes 40 are preferably created by holes being made in that part of the structure which separates the conducting patterns, which holes are filled wholly or partially with electrically conducting material.

The principle of the invention should now be clear, but for the sake of completeness, the creation of a further two layers will also be described.

Figure 1D:
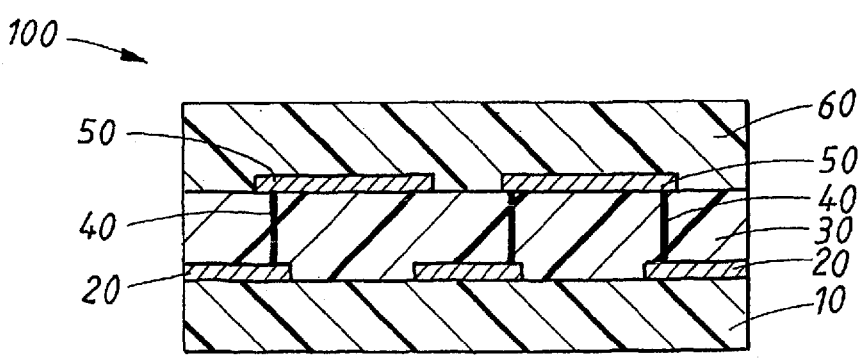

In FIG. 1d, the structure has been enlarged by a third supporting layer 60. As material for the third supporting layer 60, a material is chosen with lower melting point than the second supporting layer 30. In a preferred embodiment of the invention, a suitable material for the third supporting layer 60 is PFA, perfluoroalkoxyl.

The third supporting layer 60 has been attached to the structure 100 in a way which is analogous with the second supporting layer 30, in other words by exposing the structure inclusive of the third supporting layer 60 to a temperature which exceeds the melting point for the third supporting layer 60 but is lower than the melting point for the second supporting layer 30.

Figure 1E:
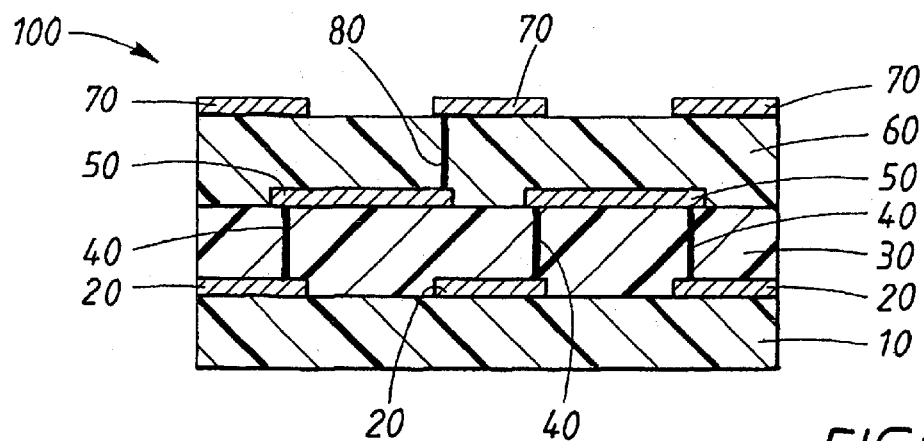

In FIG. 1e, a third conducting pattern 70 of desired shape has been arranged on the third supporting layer 60. In the same way as described above, this third conducting pattern 70 has been created when the third supporting layer 60, after heating of the structure 100, has assumed a temperature which is lower than its melting point. The third conducting pattern 70 is connected at desired locations to the second conducting pattern 50 by means of via-holes 80.

Figure 1F:
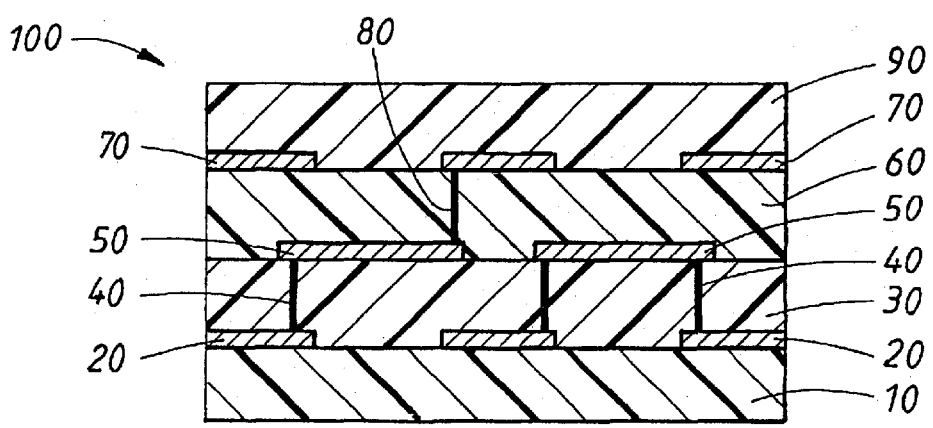

In FIG. 1f, on top of the third conducting pattern 70 there is shown a fourth supporting layer 90, which has been attached to the structure 100 in a manner which is analogous with what has been described above for other layers 10, 30, 60 in the structure 100. In a preferred embodiment of the invention, a suitable material for this fourth supporting layer 90 is FEP, fluorinated ethylenepropylene.

Figure 1G:
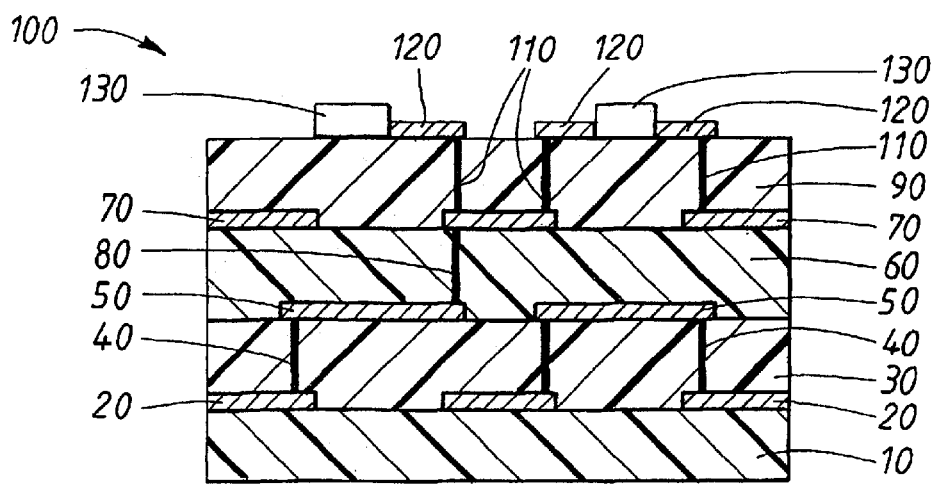

The fourth supporting layer 90 is intended to be the uppermost layer in the structure 100, for which reason not only conducting samples 120 of desired shape but also components 130, suitably electronics components, have been arranged on this fourth layer 90 in FIG. 1g. Conducting patterns 120 of desired shape have been created and components 130 have been applied to the fourth supporting layer 90 once the fourth supporting layer 90, after heating of the structure 100, has assumed a temperature which is lower than its melting point.

By means of via-holes 110 and the conducting patterns 120 on the fourth supporting layer 90, the components 130 are connected to other conducting patterns in the desired manner.

The differences between the resulting points of the various supporting layers 10, 30, 60, 90 are suitably within the range 1–1,000° C., preferably within the range 10–300° C., suitably within the range 20–200° C.

In a preferred embodiment, those conducting patterns which are arranged on the supporting strata are arranged by arranging a layer of conducting material (not shown in the figures), for example copper, which substantially covers the whole of the supporting stratum, on the supporting layers. After a supporting stratum has been attached to the structure in the above-stated manner, the desired pattern is then created in the layer of conducting material.

Figure 2:
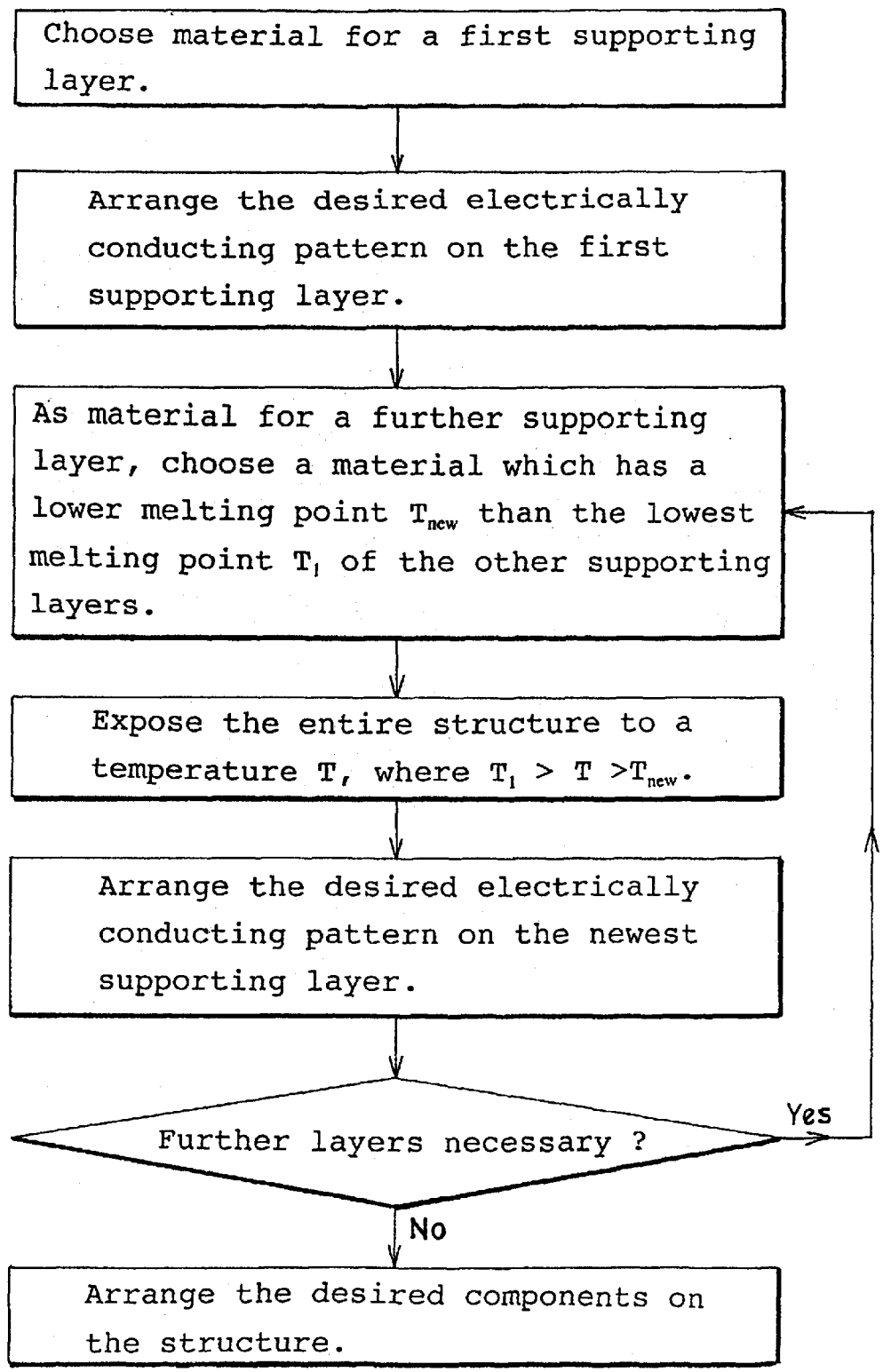
FIG. 2 shows a flow chart of a process according to the invention.

FIG. 2 shows a flow chart of a process according to the invention.

The conducting patterns on the supporting layers can be created in a large variety of ways. Three different such methods will be described below. These three methods are subtractive, semi-additive and additive methods.

A subtractive method means that essentially the whole of the surface on which it is wished to have an electrically conducting stratum is covered with electrically conducting material. Over the locations in which it is wished, at the end of the process, to have electrically conducting material, so-called "photoresist" is arranged. The surface is thereafter exposed to etching, whereby the electrically conducting stratum is removed, apart from the parts covered by the photoresist. After this, the photoresist can be removed by, for example, washing, whereby the remaining surfaces of electrically conducting material are laid bare. In other words, the surface now has electrically conducting material only at the locations in which this was desired.

A semi-additive method means that, by using, for example, a chemical method, the whole of the surface on which it is wished to have electrically conducting strata is covered with an extremely thin first stratum of electrically conducting material. Photoresist is thereafter arranged at those locations on this extremely thin stratum of electrically conducting material in which it is not wished, at the end of the process, to have electrically conducting strata. By galvanic means, for example, a somewhat thicker, second stratum of electrically conducting material, in which the surface is not covered by photoresist, is subsequently applied. The photoresist is thereafter removed, for example by washing. As a final stage, electrically conducting material is removed, for example by etching, to a depth corresponding to the thickness of the first stratum of electrically conducting material. Electrically conducting material is therefore left in place only where the second stratum of electrically conducting material has been applied.

An additive method means that the surface on which it is wished to have electrically conducting material is covered with photoresist wherever electrically conducting material is not wanted. At other locations on the surface, electrically conducting material is arranged. The photoresist is thereafter washed away, after which electrically conducting material remains on the surface, only at the desired locations.

The invention is not limited to the above-described illustrative embodiment, but can be freely varied within the scope of the following patent claims.

As material for the supporting layers, any arbitrary suitable materials with different melting points can in principle be chosen according to the principle described. Examples of other materials for supporting layers are polyamide and polyester.

The number of supporting layers, for example, can also be freely varied and is obviously not limited to the number shown above.

The structure can be further extended not only on the one side of the first supporting layer; using the method according to the invention, new supporting layers can be arranged on both sides of the first supporting layer.

Between the supporting layers bearing conducting patterns, it is conceivable to arrange other materials with a function other than to bear conducting patterns. These layers can in this case have melting points which deviate from the principle defined above according to the invention.

When a new layer is attached to the structure by heating, the new layer has to be fixed against the structure during at least part of the heating. This can be done in a large number of ways and is not fundamental to the invention, for which reason it has not been described here.

It is also conceivable to arrange conducting patterns on more than one side of the supporting layers.

What is claimed is:

1. A circuit board comprising a plurality of layers, all of different materials, each of said plurality of layers including electrically conductive patterns, wherein:

a first one of said plurality of layers is formed from a material having a first melting point and a second one of said plurality of layers adjacent to said first layer is formed from a material having a second melting point lower than said first melting point.

2. A circuit board according to claim 1, wherein said second one of said plurality of layers is disposed intermediate to said first layer and a third one of said plurality of layers, said third one of said plurality of layers being formed from a material having a third melting point lower than said second melting point.

3. A circuit board according to claim 1, wherein a side of each of said plurality of layers on which electrically conducting patterns are arranged is the side facing away from a layer with a higher melting point.

4. A circuit board according to claim 1, wherein the difference in melting point between two adjacent layers lies within the range 1–1,000° C.

5. A circuit board according to claim 1, wherein the difference in melting point between two adjacent layers lies within the range 10–300° C.

6. A circuit board according to claim 1, wherein the difference in melting point between two adjacent layers lies within the range 20–200° C.

7. A circuit board according to claim 1, wherein the electrically conducting patterns on said plurality of layers are connected through one or more of said layers, said holes filled wholly or partially with electrically conducting material.

8. A circuit board, comprising:

a first supporting layer having a first melting point;

a first conducting pattern arranged on a surface of the first supporting layer, a second supporting layer arranged adjacent the first conducting pattern and formed of a material having a second melting point, lower than the first melting point, a second conducting pattern arranged on a surface of the second support layer, the second conducting pattern being electrically connected to the first conducing pattern by a plurality of via-holes extending through the second supporting layer;

a third supporting layer arranged adjacent the second supporting material and formed of a material having a third melting point, lower than the second melting point;

a third conducting pattern arranged on a surface of the third support layer, the third conducting pattern being electrically connected to the second conducing pattern by a plurality of via-holes extending through the third supporting layer;

a fourth supporting layer arranged adjacent the third conducting layer and formed of a material having a fourth melting point, lower than the third melting point; and a fourth conducting pattern arranged on a surface of the fourth support layer, the fourth conducting pattern being electrically connected to the third conducing pattern by a plurality of via-holes extending through the fourth supporting layer.

9. A circuit board according to claim 8, wherein:

the first supporting material is formed from a PTFE material having a relatively high glass content.

10. A circuit board according to claim 8, wherein:

the third supporting material is formed from perfluoroalkoxyl.

* * * * *

UNITED STATES PATENT AND TRADEMARK OFFICE
CERTIFICATE OF CORRECTION

PATENT NO. : 6,717,063 B2
APPLICATION NO. : 09/793188
DATED : April 6, 2004
INVENTOR(S) : Bergstedt It is certified that error appears in the above-identified patent and that said Letters Patent is hereby corrected as shown below:

In Column 1, Line 14, delete "all interapaces" and insert -- small interspaces --, therefor.

In Column 4, Line 13, delete "resulting" and insert -- melting --, therefor.

In Column 6, Line 33, in Claim 8, delete "conducing" and insert -- conducting --, therefor.

Signed and Sealed this

Thirtieth Day of October, 2007

JON W. DUDAS
*Director of the United States Patent and Trademark Office*